United States Patent
Roering

(10) Patent No.: US 8,508,934 B2
(45) Date of Patent: Aug. 13, 2013

(54) AIRCRAFT SIGNAL COMPUTER SYSTEM HAVING A PLURALITY OF MODULAR SIGNAL COMPUTER UNITS

(75) Inventor: Sebastian Roering, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 207 days.

(21) Appl. No.: 13/059,528

(22) PCT Filed: Aug. 13, 2009

(86) PCT No.: PCT/EP2009/005884
§ 371 (c)(1),
(2), (4) Date: Apr. 18, 2011

(87) PCT Pub. No.: WO2010/022863
PCT Pub. Date: Mar. 4, 2010

(65) Prior Publication Data
US 2011/0188198 A1    Aug. 4, 2011

Related U.S. Application Data

(60) Provisional application No. 61/092,103, filed on Aug. 27, 2008.

(30) Foreign Application Priority Data

Aug. 27, 2008   (DE) .................. 10 2008 044 645

(51) Int. Cl.
*H05K 7/20*    (2006.01)
(52) U.S. Cl.
USPC ...... 361/679.53; 361/699; 361/700; 361/702; 165/104.19; 165/104.21; 165/104.33
(58) Field of Classification Search
USPC ............. 361/679.46, 679.53, 679.54, 688, 361/689, 690–692, 698, 699, 702–712, 714–727; 165/80.4, 80.5, 104.33, 104.34, 104.14, 165/104.21, 185; 62/259.2; 714/15.1, 15.2, 714/16.3; 257/714–716
See application file for complete search history.

(56) References Cited

U.S. PATENT DOCUMENTS 3,334,684 A * 8/1967 Mazorol, Jr. et al. ........... 165/47
4,635,709 A * 1/1987 Altoz ............................. 165/272

(Continued)

FOREIGN PATENT DOCUMENTS

| DE | 2354260 | 6/1974 |
| DE | 102006041788 | 3/2008 |

(Continued)

OTHER PUBLICATIONS

European Patent Office, International Search Report, Form PCT/ISA/210 (3 pgs.) Nov. 17, 2009, Form PCT/ISA/220 (3 pgs.) and PCT form PCT/ISA/237 (6 pgs.).

*Primary Examiner* — Michail V Datskovskiy
(74) *Attorney, Agent, or Firm* — Wood, Herron & Evans, LLP

(57) ABSTRACT

An aircraft signal computer system includes a plurality of modular signal computer units and a liquid cooling device for cooling the modular signal computer units. The liquid cooling device includes a coolant line, which is connectable to a central liquid cooling system of an aircraft in order to supply a liquid coolant medium at a desired low temperature to the liquid cooling device. The coolant line of the liquid cooling device is in thermal surface contact with the modular signal computer units in order to dissipate heat from the modular signal computer units. A heat-emitting component of the modular signal computer units may be in thermal contact with a coolant bath or an internal heat conductor for removing heat energy.

9 Claims, 4 Drawing Sheets

(56) References Cited

U.S. PATENT DOCUMENTS

| | | | |
|---|---|---|---|
| 4,962,444 A * | 10/1990 | Niggemann | 361/702 |
| 5,702,073 A * | 12/1997 | Fluegel | 244/57 |
| 6,115,251 A * | 9/2000 | Patel et al. | 361/699 |
| 6,536,510 B2 * | 3/2003 | Khrustalev et al. | 165/104.33 |
| 6,796,372 B2 * | 9/2004 | Bear | 165/104.21 |
| 6,972,365 B2 * | 12/2005 | Garner | 174/16.3 |
| 7,012,807 B2 * | 3/2006 | Chu et al. | 361/699 |
| 7,193,850 B2 * | 3/2007 | Pal | 361/700 |
| 7,403,392 B2 * | 7/2008 | Attlesey et al. | 361/699 |
| 7,414,845 B2 * | 8/2008 | Attlesey et al. | 361/699 |
| 7,450,384 B2 * | 11/2008 | Tavassoli et al. | 361/699 |
| 7,508,670 B1 * | 3/2009 | Thorson et al. | 361/699 |
| 7,626,820 B1 * | 12/2009 | Konshak et al. | 361/700 |
| 7,697,292 B2 * | 4/2010 | Uluc et al. | 361/699 |
| 7,907,409 B2 * | 3/2011 | Wyatt et al. | 361/700 |
| 7,920,382 B2 * | 4/2011 | Uluc et al. | 361/696 |
| 7,967,249 B2 * | 6/2011 | Muhlthaler et al. | 244/118.5 |
| 8,014,150 B2 * | 9/2011 | Campbell et al. | 361/700 |
| 8,035,759 B2 * | 10/2011 | Kawamura | 349/9 |
| 8,315,053 B2 * | 11/2012 | Uluc et al. | 361/696 |
| 8,331,093 B2 * | 12/2012 | Uluc et al. | 361/719 |
| 2003/0000721 A1 | 1/2003 | Garner | |
| 2005/0068728 A1 | 3/2005 | Chu et al. | |
| 2007/0291452 A1 * | 12/2007 | Gilliland et al. | 361/699 |
| 2009/0260777 A1 * | 10/2009 | Attlesey | 165/67 |
| 2010/0071386 A1 * | 3/2010 | Reiss et al. | 62/3.61 |

FOREIGN PATENT DOCUMENTS

| | | |
|---|---|---|
| DE | 102006060765 | 4/2008 |
| GB | 22113690 | 6/1989 |
| WO | 2008061712 | 5/2008 |

* cited by examiner

AIRCRAFT SIGNAL COMPUTER SYSTEM HAVING A PLURALITY OF MODULAR SIGNAL COMPUTER UNITS

This application claims priority, under Section 371 and/or as a continuation under Section 120, to PCT Application No. PCT/EP2009/005884, filed on Aug. 13, 2009, which claims priority to German Application No. 10 2008 044 645.9 and also to U.S. Provisional Application No. 61/092,103, both filed on Aug. 27, 2008.

TECHNICAL FIELD

The invention relates to an aircraft signal computer system which is provided for use in an aircraft and includes a plurality of modular signal computer units.

BACKGROUND

Signal computer systems used on board an aircraft, inter alia, for controlling safety-relevant functions, such as, for example, the autopilot system or the flight management system are air-cooled at present. The air cooling can be performed either by free convection or by forced ventilation. While in the case of free convection a cooling air flow is established merely on account of local dense differences of the air, in the case of forced ventilation additional fans are used to supply cooling air, provided by the aircraft air conditioning system, to the signal computers to be cooled. Forced ventilation enables the dissipation of greater quantities of heat from the signal computers to be cooled than free convection. However, the fans required for forced ventilation increase the weight of the aircraft and generate heat which has to be additionally dissipated. Moreover, with the fans, additional mechanical components are introduced into the aircraft. As a result, the failure probability of the cooling is increased.

A further disadvantage of the air-cooled signal computers currently used is that the computers have to be designed to ensure proper heat dissipation from the computers according to a cooling standard. This cooling standard specifies a maximum heat emission based on a standardised apparatus housing volume. In other words, the cooling standard prescribes a minimum apparatus housing volume or a minimum contact surface of the apparatus housing with the ambient air for a quantity of heat generated by a signal computer and to be dissipated to the environment. The requirement to comply with the cooling standard thus limits the possibility of constructing the signal computers so as to be more compact and powerful.

For the cooling of power electronics, it is known to use liquid heat exchangers, such as, for example, cold plates. These liquid heat exchangers are matched, with regard to their construction, exactly to the geometric dimensions of the electronic equipment to be cooled and are positioned as close as possible to the heat-emitting electronic equipment. For example, cold plates can be arranged in interspaces of the electronic equipment to cool. Liquid cooling systems are much better suited to removing large quantities of heat than gas or air cooling systems. However, in the case of a cooling system comprising cold plates it is necessary to provide, for each cold plate, two separate coolant connections connected to a corresponding coolant circuit. The assembly and in particular the maintenance of a cold-plate liquid cooling system is therefore very costly. Furthermore, the probability of a coolant leak owing to the additionally required coolant connections increases with each cold plate present in the cooling system, with the result that the availability of the electronic equipment may potentially be reduced. A further disadvantage of known power electronics liquid cooling systems is that current coolant couplings increase the differential pressure in the coolant circuit. This reduces the efficiency of the liquid cooling, since an increased pumping capacity is required to deliver the coolant liquid through the coolant circuit.

The invention is directed at the object of providing a powerful, compactly constructed and efficiently cooled aircraft signal computer system.

SUMMARY OF THE INVENTION

This object is achieved by an aircraft signal computer system described below.

The aircraft signal computer system according to the invention comprises a plurality of modular signal computer units and a liquid cooling device for cooling the modular signal computer units. The liquid cooling device comprises a coolant line, which is connectable to a central liquid cooling system of an aircraft in order to supply a liquid coolant medium at a desired low temperature to the liquid cooling device. Owing to the connection of the coolant line of the liquid cooling device to the central aircraft liquid cooling system, the liquid cooling line does not have to be provided with a separate refrigerating machine, but can be supplied with cooling energy by the central liquid cooling system of the aircraft. By dispensing with a separate refrigerating machine, weight and installation-space savings can be achieved. The coolant line of the liquid cooling device can be directly connected to a coolant circuit of the central aircraft liquid cooling system, so that coolant medium flowing through the coolant circuit of the central aircraft liquid cooling system can be supplied to the coolant line of the liquid cooling device. To control the supply of the coolant medium from the coolant circuit of the central aircraft liquid cooling system into the coolant line of the liquid cooling device and/or to control the removal of the coolant medium from the coolant line of the liquid cooling device into the coolant circuit of the central aircraft liquid cooling system, corresponding valves, for example, can be provided. A direct coupling of the coolant line of the liquid cooling device to the coolant circuit of the central aircraft liquid cooling system enables a particularly simply and compactly constructed, lightweight cooling device to be achieved. Alternatively to this, however, merely a thermal coupling of the coolant line of the liquid cooling device to the coolant circuit of the central aircraft liquid cooling system, for example via a suitable heat exchanger, is also conceivable. Such an arrangement would be suitable, for example, when a different coolant medium is used in the coolant circuit of the central aircraft liquid cooling system from that in the liquid cooling device of the aircraft signal computer system according to the invention.

The coolant line, through which liquid coolant medium flows, of the liquid cooling device is in thermal surface contact with the modular signal computer units in order to dissipate heat from the modular signal computer units. In the case of the aircraft signal computer system according to the invention, the coolant line of the liquid cooling device thus serves to supply a plurality of modular signal computer units to be cooled, over their surface, with the required cooling energy. For example, the coolant line of the liquid cooling device can be thermally coupled to a housing surface or a housing surface section of the modular signal computer units to be cooled. In the case of the aircraft signal computer system according to the invention, it is therefore possible to dispense with cold plates, or similar devices, assigned to the individual modular signal computer units and having separate coolant connections.

In comparison with air cooling, the liquid cooling device of the aircraft signal computer system according to the invention enables a markedly more efficient heat dissipation from the heat-generating components of the modular signal computer units. Therefore, the modular signal computer units of the aircraft signal computer system according to the invention can be operated at a lower temperature level and consequently with a significantly lower failure probability than air-cooled units. Moreover, the high cooling capacity of the liquid cooling device enables the integration of powerful electronic components in compact signal computer units. A further advantage of the aircraft signal computer system according to the invention is that the liquid cooling device involves relatively low assembly and maintenance costs owing to the fact that cooling arrangements assigned to the individual modular signal computer units and having separate coolant connections are dispensed with. Furthermore, in the case of the liquid cooling device of the aircraft signal computer system according to the invention, there is only a low risk of leakage. Finally, an additional heat input into the entire system, caused in conventional power electronics liquid cooling systems by pressure losses at the coolant connections, is avoided.

The liquid cooling device of the aircraft signal computer system according to the invention can comprise merely one coolant line through which liquid coolant medium flows. Alternatively to this, however, the liquid cooling device can also have a plurality of coolant lines which are each in thermal surface contact with the modular signal computer units to be cooled. A plurality of coolant lines enable a particularly efficient heat dissipation from the modular signal computer units to be cooled, but may potentially increase the weight of the entire system. Therefore, it may be advantageous to integrate the coolant line(s) of the liquid cooling system, for example, in a carrier for receiving the modular signal computer units.

The coolant line, through which liquid coolant medium flows, of the liquid cooling device can be in thermal surface contact with the with the modular signal computer units to be cooled, via suitable heat exchangers, for example surface heat exchangers arranged in the region of a housing surface of the modular signal computer units to be cooled. Alternatively to this, however, the coolant line of the liquid cooling device can also be in direct thermal surface contact with the modular signal computer units to be cooled. For example, the coolant line can be configured in the form of a cooling rail which is routed along the housings of the modular signal computer units to be cooled and is in direct thermal surface contact with the housings. The housings of the modular signal computer units to be cooled can also be provided with suitably shaped openings in the region of the contact surfaces with the coolant line of the liquid cooling device. The coolant line of the liquid cooling device is then preferably routed so that it runs in the region of the openings and thereby forms a section of the housing of the modular signal computer units to be cooled.

If desired, the coolant line of the liquid cooling device can also be integrated, in a weight- and installation-space-saving manner, in a carrier for receiving the modular signal computer units. Furthermore, the coolant line can have a shape which is suitable for improving the heat transfer from the modular signal computer units to be cooled to the coolant medium flowing through the coolant line. If desired or required, the coolant line can be of spiral-shaped configuration or have an otherwise wound or coiled shape which is suitable for enabling a large-area surface contact with the modular signal computer units to be cooled.

Especially when the coolant line of the liquid cooling device is configured in a particularly weight- and installation-space-saving manner, for example in the form of a cooling rail, and only relatively small contact areas are present between the coolant line and the modular signal computer units to be cooled, it may be necessary to take measures which make it possible to increase the heat flow density of the contact area between the coolant line and the modular signal computer units to be cooled and thus the efficiency of the heat transfer from the modular signal computer units to be cooled to the coolant liquid flowing through the coolant line of the liquid cooling device.

For this purpose, a heat-emitting component of a modular signal computer unit to be to cooled can, for example, be thermally coupled to an internal heat conductor which establishes a heat-conducting connection between the heat-emitting component and the coolant line of the liquid cooling device. For example, a first end of the internal heat conductor can be thermally coupled to the heat-emitting component, while a second end of the internal heat conductor can be thermally coupled to a section of a housing surface of the modular signal computer unit to be cooled, which section, for its part, is in thermal connection with the liquid coolant medium flowing through the coolant line of the liquid cooling device. The heat transfer from the heat-emitting component to the coolant medium flowing through the coolant line of the liquid cooling device is optimised and intensified by such an arrangement.

The heat-emitting component of the modular signal computer unit can, for example, be a printed circuit board. A conventional heat pipe, for example, can be used as the internal heat conductor. If desired or required, a plurality of heat-emitting components of the modular signal computer unit can be thermally coupled to the coolant line of the liquid cooling device with the aid of corresponding internal heat conductors. Furthermore, a heat-emitting component of the modular signal computer unit can also be thermally coupled to the coolant line of the liquid cooling device with the aid of a plurality of internal heat conductors.

For the thermal coupling of the internal heat conductor to the heat-emitting component of the modular signal computer unit a corresponding interface can be provided on the heat-emitting component. Additionally or alternatively to this, for the thermal coupling of the internal heat conductor to the coolant medium flowing through the coolant line of the liquid cooling device a corresponding interface can be provided on a section of a housing of the modular signal computer unit, which section is in thermal surface contact with the coolant fluid flowing through the coolant line of the liquid cooling device. The interface(s) can be of plate-shaped configuration and consist of a material which is a good heat conductor, such as, for example, copper or aluminium. For example, it is conceivable to provide on the surface of a printed circuit board forming a heat-emitting component an interface in the shape of a plate made of a material which is a good heat conductor and to couple this interface thermally to the first end of the internal heat conductor. Similarly, it is possible to integrate in a section of a housing of the modular signal computer, which section is in thermal surface contact with the coolant liquid flowing through the coolant line of the liquid cooling device, an interface in the shape of a plate made of a material which is a good heat conductor, which interface can be thermally coupled to the second end of the internal heat conductor. The housing section which is in thermal surface contact with the coolant liquid flowing through the coolant line of the liquid cooling device can, as described above, also be formed by a section of the coolant line of the liquid cooling device, which section extends in the region of a housing opening.

A heat exchanger surface can be arranged at a first and/or a second end of the internal heat conductor. For example, the heat exchanger surface can be formed by planar outlets of the internal heat conductor which consist of a material which is a good heat conductor, such as, for example, copper or aluminium. The heat exchanger surfaces of the internal heat conductor form, together with an interface provided on a heat-emitting component of the modular signal computer unit or a housing section of the modular signal computer unit, a contact heat exchanger which enables an optimised heat transfer from the heat-emitting component of the modular signal computer unit to the internal heat conductor or from the internal heat conductor to the housing section of the modular signal computer unit and consequently to the coolant liquid flowing through the coolant line of the liquid cooling device.

The heat-emitting component of the modular signal computer unit can be in thermal contact with a coolant bath which, for its part, is thermally coupled to the coolant line of the liquid cooling device. For example, a housing or a housing section of the modular signal computer unit can be fluid-tightly designed and provided for holding a coolant medium, which is in thermal contact with the heat-emitting component of the modular signal computer unit, for example by means of a suitable heat exchanger, in order to dissipate heat from the heat-emitting component.

Alternatively to this, the heat-emitting component can also be partially or completely immersed in a coolant bath arranged in a housing or a housing section of the modular signal computer unit, so that the heat-emitting component of the modular signal computer unit is completely or partially surrounded by the coolant medium of the coolant bath.

The thermal coupling between the coolant bath and the coolant line, through which liquid coolant medium flows, of the liquid cooling device can be established via a section of the housing of the modular signal computer unit, which section is cooled by the coolant medium flowing through the coolant line of the liquid cooling device. This housing section can be designed to form a condensation surface on which coolant medium, evaporated from the coolant bath by the heat emission of the component of the modular signal computer unit, condenses with heat abstraction. In the operation of such an arrangement, liquid coolant medium evaporates from the coolant bath owing to the heat transfer from the heat-emitting component to the coolant medium, so that the heat-emitting component can be cooled particularly effectively by the cooling energy released during the evaporation of the coolant medium. In order to ensure proper functioning of such a 2-phase cooling, it is necessary to use a coolant medium whose evaporation temperature lies within a desired cooling temperature range of the heat-emitting component. The coolant medium evaporated from the coolant bath is changed back into the liquid state of aggregation again on the condensation surface and drops without loss back into the coolant bath.

The heat-emitting component of the modular signal computer unit can be in thermal contact with a substrate which on account of its capillary action is designed to conduct coolant medium from the coolant bath along a surface of the component. The substrate is preferably formed and arranged in such a way that it covers at least part of the surface of the heat-emitting component. By using a substrate as the "conducting medium" for the coolant medium from the coolant bath, the heat-emitting component no longer has to be immersed over a large area or completely in the coolant bath in order to have the large-area contact, necessary for proper cooling, with the coolant medium from the coolant bath. The coolant medium from the coolant bath can flow through the capillaries of the substrate in the liquid state. A particularly efficient cooling of the heat-emitting component is possible, however, when the coolant medium evaporates on flowing through the capillaries of the substrate as a result of the heat transfer from the heat-emitting component. For the condensation of evaporated coolant medium, there can be provided, in turn, a condensation surface which is in thermal surface contact with the coolant medium flowing through the coolant line of the liquid cooling device.

In order to ensure the desired capillary action, the substrate can consist of a porous material. For example, the substrate can consist of a ceramic sintered material, a textile material or a braided material.

BRIEF DESCRIPTION OF THE DRAWINGS

The aircraft signal computer system according to the invention is explained in detail below with reference to the attached schematic figures, in which.

DETAILED DESCRIPTION

Figure 1:
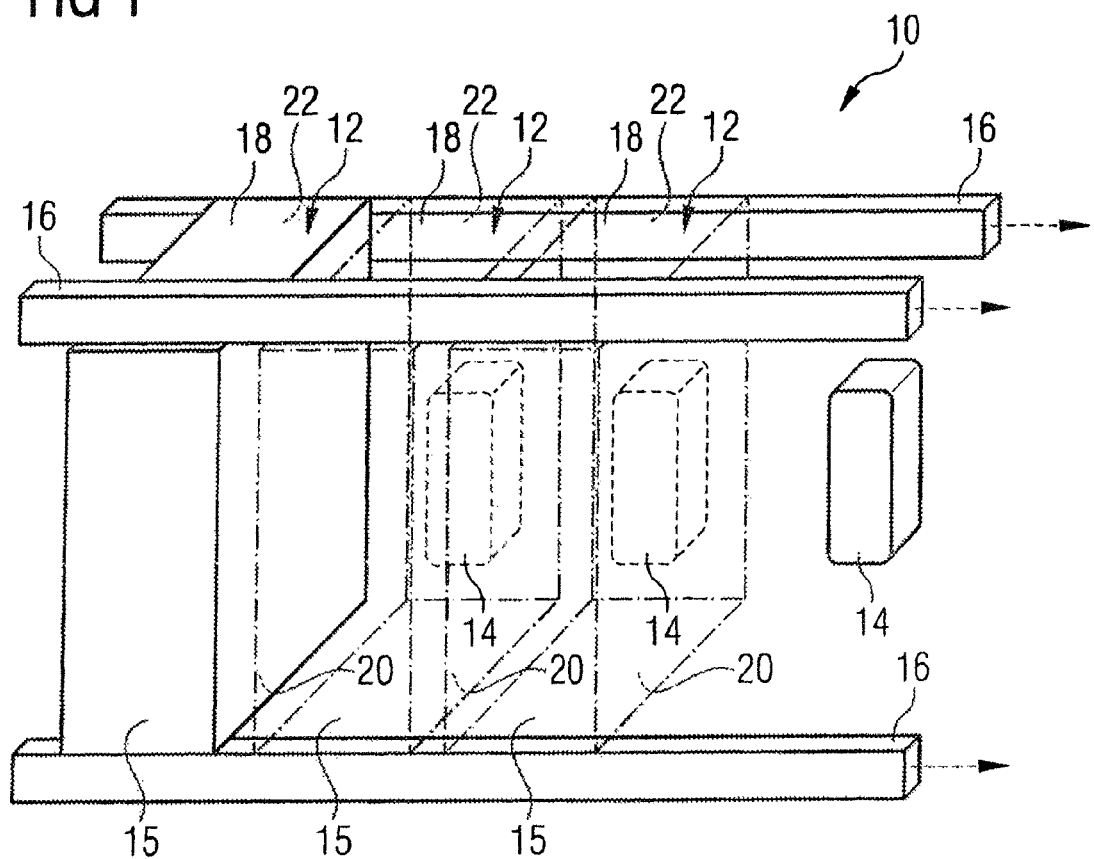
FIG. 1 shows an aircraft signal computer system having a plurality of modular signal computer units and a liquid cooling device for cooling the modular signal computer units.

FIG. 1 shows an aircraft signal computer system 10 which is provided for use in a commercial aircraft and comprises a plurality of modular signal computer units 12. Each modular signal computer unit 12 can be connected to an electronic system of the aircraft via a plug-in contact 14 which is designed to cooperate with a complementary plug-in contact formed on a housing 15 of the modular signal computer unit 12. The modular signal computer unit 12 is detachably fixed in its position in the aircraft signal computer system 10 by the connection of the plug-in contacts. If required, for example when carrying out maintenance work, the modular signal computer unit 12 can thus be removed from its plug-in station in the aircraft signal computer system 10 again.

The aircraft signal computer system 10 further comprises a liquid cooling device for cooling the modular signal computer units 12. The liquid cooling device has at least one coolant line 16, which can be connected to a central liquid cooling system of an aircraft in order to supply a liquid coolant medium at a desired low temperature to the liquid cooling device. The liquid cooling device thus does not have to be provided with a separate refrigerating machine, but can be supplied with cooling energy by the central liquid cooling system of the aircraft. In the exemplary embodiment shown in FIG. 1, three exemplary arrangements of a coolant line 16 configured in the form of a cooling rail and being in direct thermal surface contact with the modular signal computer units 12 to be cooled are shown. The liquid cooling device can comprise merely one coolant line 16. If desired or required, however, a plurality of coolant lines 16 can also be present.

The coolant lines 16 illustrated in FIG. 1 each have a square cross-section. This makes it possible to increase a contact area between a coolant line 16 and a surface section of the housing 15 of a modular signal computer unit 12 to be cooled and thereby ensure optimised heat transfer from the modular signal computer unit 12 to be cooled to the coolant liquid flowing through the coolant line 16. If desired or required, however, the coolant lines 16 can also have any other cross-section. Furthermore, the coolant lines 16 extend along side walls 18, 20 and/or rear walls 22 of the housings 15 of the modular signal computer units 12 to be cooled, so that they do not hinder the mounting and demounting of the modular signal computer units 12.

Figure 2:
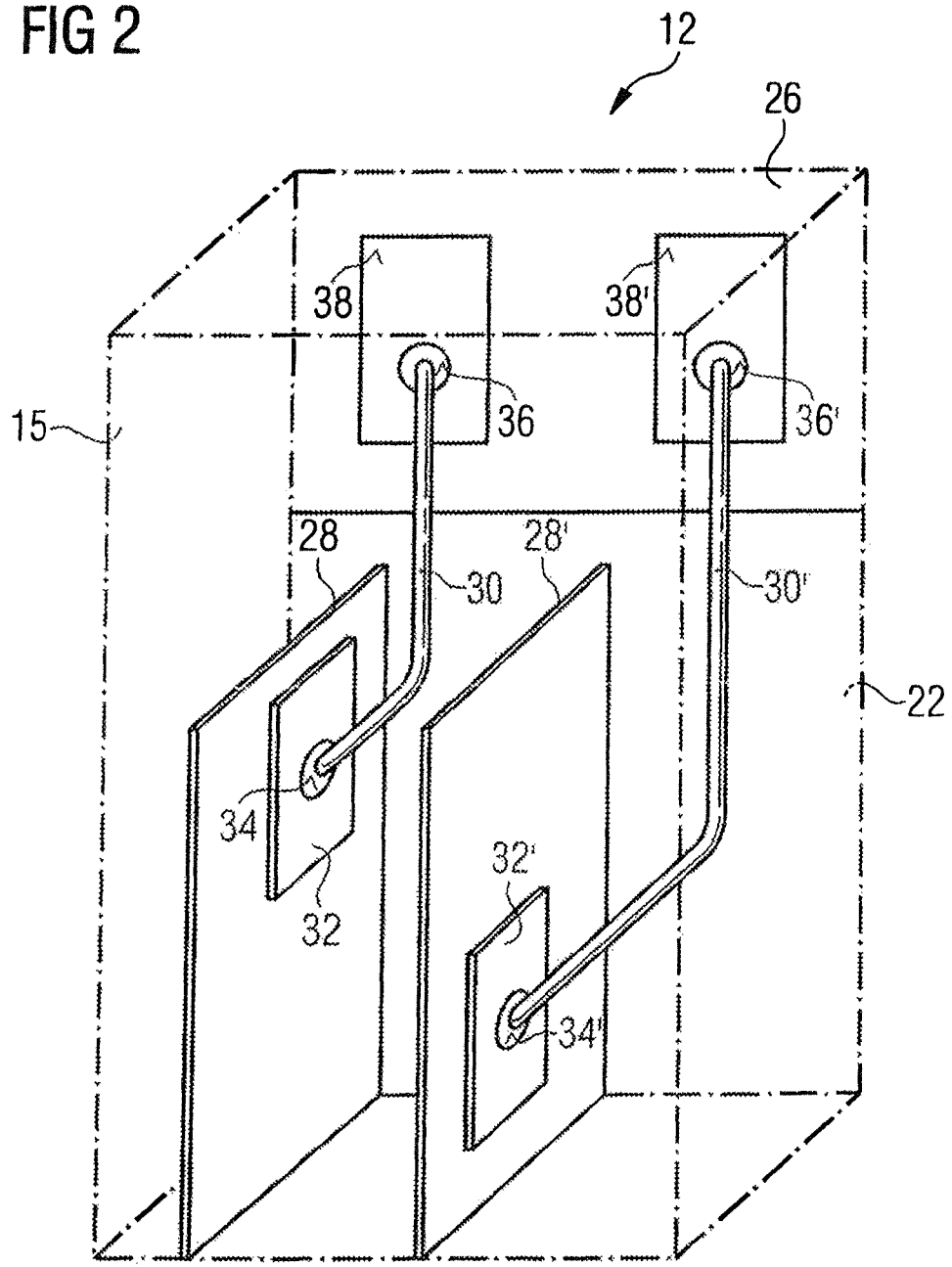
FIG. 2 shows a first embodiment of a modular signal computer unit according to FIG. 1.
Figure 3:
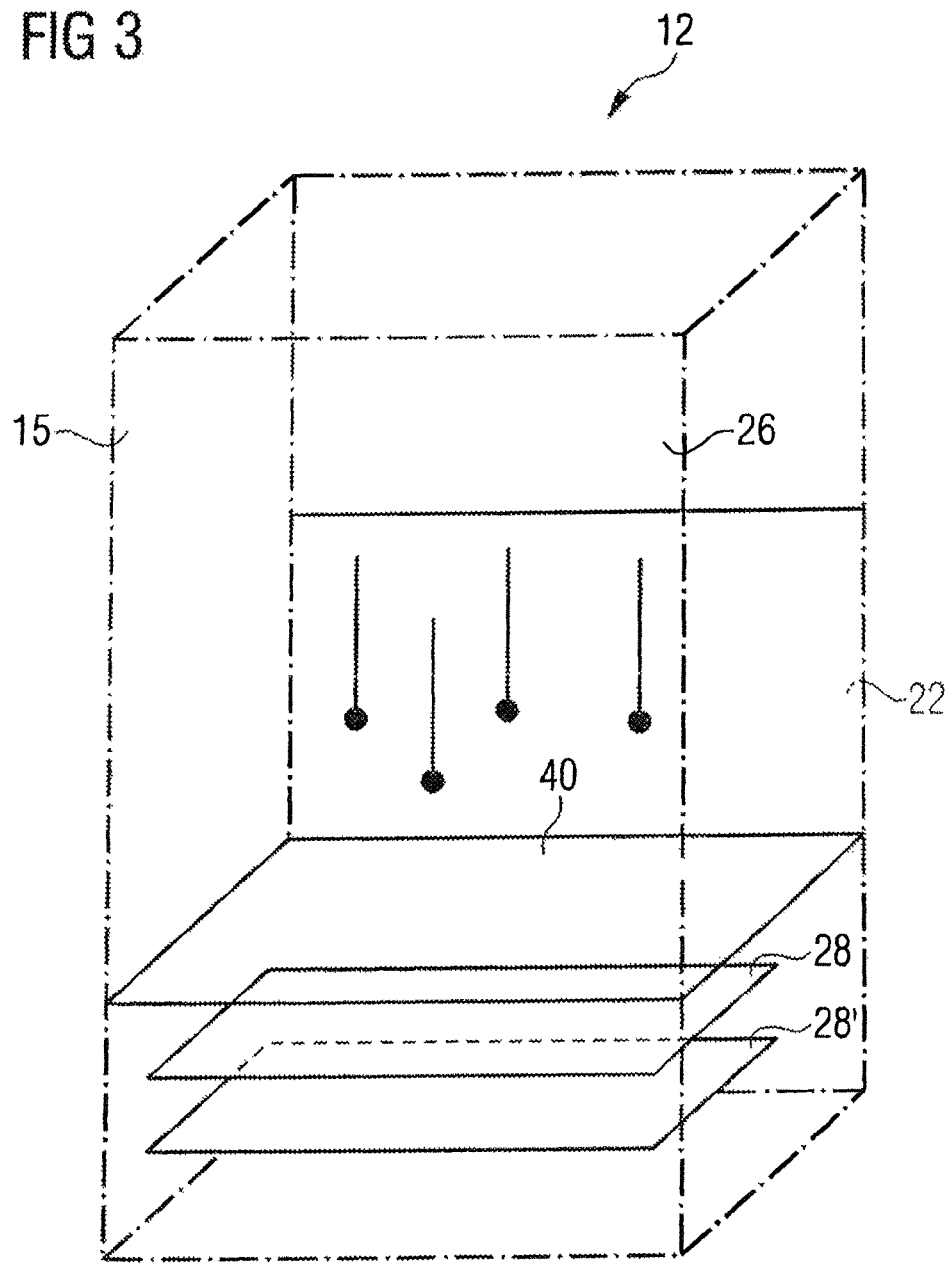
FIG. 3 shows a second embodiment of a modular signal computer unit according to FIG. 1.
Figure 4:
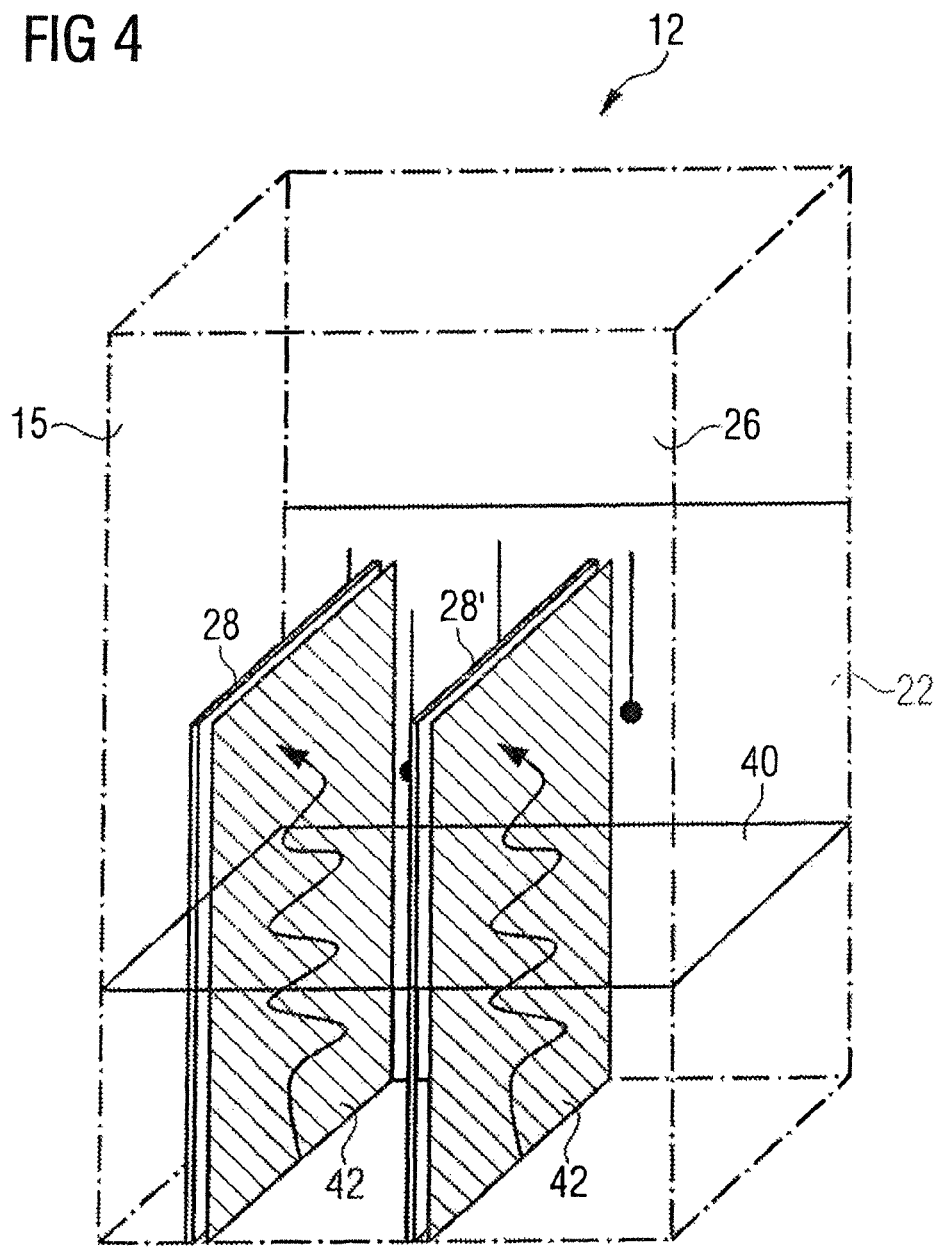
FIG. 4 shows a third embodiment of a modular signal computer unit according to FIG. 1.

FIGS. 2 to 4 show three different embodiments of a modular signal computer unit 12 which enable optimised heat transfer from the modular signal computer unit 12 to the coolant liquid flowing through a coolant line 16 of the liquid cooling device.

In the case of the modular signal computer unit 12 illustrated in FIG. 2, the housing 15 of the modular signal computer unit 12 is provided in the region of its rear wall 22 with an opening. A section 26 of the coolant line 16, shown in FIG. 1, of the liquid cooling device extends in the region of this opening and thus forms an integral part of the housing 15. In the housing 15 of the modular signal computer unit 12 there are arranged two components 28, 28' which are configured in the form of printed circuit boards fitted with electronic components and which emit heat.

The components 28, 28' are each thermally coupled to an internal heat conductor 30, 30'. For this purpose, an interface 32, 32' of plate-shaped configuration is provided on each of the components 28, 28'. The interfaces 32, 32' are each connected to a first heat exchanger surface 34, 34' which is arranged at a first end of the internal heat conductors 30, 30'. Second heat exchanger surfaces 36, 36' are arranged at a second end of the internal heat conductors 30, 30'. The second heat exchanger surfaces 36, 36' are each connected to an interface 38, 38' of plate-shaped configuration which is provided on the section 26 of the coolant line 16. The interfaces 32, 32', 38, 38', the first heat exchanger surfaces 34, 34' and the second heat exchanger surfaces 36, 36' each consist of a heat-conducting material, such as, for example, aluminium or copper.

The internal heat conductors 30, 30' comprise heat pipes which are of tubular configuration and are sealed fluid-tightly at their ends by a heat-conducting material. Formed in the heat pipes is a capillary structure which can be produced, for example, by copper braiding. The heat pipes also hold a liquid, the evaporating temperature of which lies within the desired cooling temperature range of the components 28, 28'. Owing to the waste heat generated by the components 28, 28', at least some of the liquid contained in the heat pipes evaporates and is conducted by the capillary structure of the heat pipes, according to the wicking principle, in the direction of the end of the heat pipes which is thermally coupled to the coolant line 16, where the liquid condenses again and flows back in the capillary structure of the heat pipes in the direction of the heat-emitting components 28, 28'.

In the case of the modular signal computer unit shown in FIG. 3, the housing 15 is fluid-tightly designed and serves for holding a coolant bath 40. The components 28, 28' to be cooled are arranged in the housing 15 in such a way that they are completely covered by the inertly and non-electrically-conducting coolant medium of the coolant bath 40. The evaporating temperature of the coolant medium of the coolant bath 40 lies within the desired cooling temperature range of the heat-emitting components 28, 28'. Owing to the emitted heat of the components 28, 28', the coolant medium evaporates from the coolant bath 40. The evaporated liquid condenses on the housing section formed by the section 26 of the coolant line 16 of the liquid cooling device, with abstraction of heat energy, and flows on the rear wall 22 of the housing 15 back into the coolant bath 40. The cooling of the heat-emitting components 28, 28' is achieved here by direction evaporation of liquid from the coolant bath 40.

In the case of the modular signal computer unit depicted in FIG. 4, the housing 15 is likewise fluid-tightly designed and holds a coolant bath 40. The components 28, 28' to be cooled are, however, only partially covered by the coolant medium of the coolant bath 40. A substrate 42 is applied to the surfaces of each of the components 28, 28'. The structure of the substrates 42 produces a capillary action. The substrates 42 can be formed, for example, from a sintered material, a textile material or a metal braid.

Coolant medium rises from the coolant bath 40 owing to the capillary action of the substrates 42 and flows along the surfaces of the components 28, 28'. Owing to the emitted heat of the components 28, 28', the liquid coolant medium evaporates and cools the components 28, 28' in the process. Finally, the evaporated coolant medium from the coolant bath 40 condenses, in a manner similar to that in the case of the arrangement according to FIG. 3, on the section 26 of the coolant line 16, with abstraction of heat energy, and flows on the rear wall 22 of the housing 15 back into the coolant bath 40.

The invention claimed is:

1. An aircraft signal computer system comprising:
   a plurality of modular signal computer units which are each arranged in a housing, and
   a liquid cooling device for cooling the modular signal computer units, the liquid cooling device comprising a coolant line, which is connectable to a central liquid cooling system of an aircraft in order to supply a liquid coolant medium at a desired low temperature to the liquid cooling device, and the coolant line of the liquid cooling device being thermally coupled with outer surfaces or outer surface sections of the housings of the modular signal computer units in order to dissipate heat from the modular signal computer units,
   wherein a heat-emitting component of a modular signal computer unit is in thermal contact with a coolant bath which is thermally coupled to the coolant line of the liquid cooling device, the heat-emitting component of the modular signal computer unit being in thermal contact with a substrate which on account of capillary action is designed to conduct coolant medium from the coolant bath along a surface of the component.

2. The aircraft signal computer system according to claim 1, wherein the coolant line of the liquid cooling device is in direct thermal surface contact with outer surfaces or outer surface sections of the housings of the modular signal computer units to be cooled.

3. An aircraft signal computer system, comprising:
   a plurality of modular signal computer units which are each arranged in a housing, and
   a liquid cooling device for cooling the modular signal computer units, the liquid cooling device comprising a coolant line, which is connectable to a central liquid cooling system of an aircraft in order to supply a liquid coolant medium at a desired low temperature to the liquid cooling device, and the coolant line of the liquid cooling device being thermally coupled with outer surfaces or outer surface sections of the housings of the modular signal computer units in order to dissipate heat from the modular signal computer units,
   wherein a heat-emitting component of a modular signal computer unit is thermally coupled to an internal heat conductor which establishes a heat-conducting connection between the heat-emitting component and the coolant line of the liquid cooling device.

4. The aircraft signal computer system according to claim 3, wherein for the thermal coupling of the internal heat conductor to the heat-emitting component of the modular signal computer unit a corresponding interface is provided on the heat-emitting component, and/or wherein for the thermal coupling of the internal heat conductor to the coolant medium flowing through the coolant line of the liquid cooling device a corresponding interface is provided on a section of a housing of the modular signal computer unit.

5. The aircraft signal computer system according to claim 3, wherein a heat exchanger surface is arranged at a first end and/or a second end of the internal heat conductor.

6. The aircraft signal computer system according to claim 1, wherein the heat-emitting component of the modular signal computer unit is immersed in the coolant bath so that the heat-emitting component is partially or completely surrounded by the coolant medium of the coolant bath.

7. The aircraft signal computer system according to claim 1, wherein the thermal coupling between the coolant bath and the coolant line of the liquid cooling device is established via a section of a housing of the modular signal computer unit, which section is cooled by the coolant medium flowing through the coolant line of the liquid cooling device and is designed to form a condensation surface on which coolant medium, evaporated from the coolant bath by the heat emission of the component of the modular signal computer unit, condenses with heat abstraction.

8. The aircraft signal computer system according to claim 1, wherein the substrate is produced from a porous material.

9. The aircraft signal computer system according to claim 3, wherein the coolant line of the liquid cooling device is in direct thermal surface contact with outer surfaces or outer surface sections of the housings of the modular signal computer units to be cooled.

* * * * *